United States Patent
Kim

(10) Patent No.: US 9,018,759 B2
(45) Date of Patent: Apr. 28, 2015

(54) SEMICONDUCTOR PACKAGE SUBSTRATE AND SEMICONDUCTOR PACKAGE INCLUDING THE SAME

(71) Applicant: SK Hynix Inc., Icheon-si Gyeonggi-do (KR)

(72) Inventor: Jong Hoon Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 212 days.

(21) Appl. No.: 13/656,339

(22) Filed: Oct. 19, 2012

(65) Prior Publication Data

US 2013/0099375 A1   Apr. 25, 2013

(30) Foreign Application Priority Data

Oct. 19, 2011 (KR) .................. 10-2011-0107107

(51) Int. Cl.
| | |
|---|---|
| H01L 23/48 | (2006.01) |
| H01L 23/52 | (2006.01) |
| H01L 29/40 | (2006.01) |
| H01L 23/13 | (2006.01) |
| H01L 23/00 | (2006.01) |
| H01L 23/367 | (2006.01) |
| H01L 23/498 | (2006.01) |

(52) U.S. Cl.
CPC .............. *H01L 23/13* (2013.01); *H01L 24/17* (2013.01); *H01L 2224/16225* (2013.01); *H01L 2224/32225* (2013.01); *H01L 2224/73204* (2013.01); *H01L 2924/15311* (2013.01); *H01L 23/3677* (2013.01); *H01L 23/49816* (2013.01); *H01L 23/49827* (2013.01)

(58) Field of Classification Search
CPC .............................................. H01L 2224/05571
USPC ......................... 257/E23.183, E23.008, 680
See application file for complete search history.

(56) References Cited

U.S. PATENT DOCUMENTS

| | | | | |
|---|---|---|---|---|
| 4,613,891 | A * | 9/1986 | Ng et al. ........................ | 257/777 |
| 5,674,785 | A * | 10/1997 | Akram et al. .................. | 438/15 |
| 6,013,948 | A * | 1/2000 | Akram et al. ................. | 257/698 |
| 6,833,613 | B1 * | 12/2004 | Akram et al. ................. | 257/686 |
| 2002/0121692 | A1 * | 9/2002 | Lee et al. ....................... | 257/737 |

FOREIGN PATENT DOCUMENTS

JP   57-192052 A   11/1982

* cited by examiner

*Primary Examiner* — Evan Pert
*Assistant Examiner* — Shaka White
(74) *Attorney, Agent, or Firm* — William Park & Associates Patent Ltd.

(57) ABSTRACT

A semiconductor package substrate including a substrate body having a front surface configured for mounting a semiconductor chip on the front surface and a rear surface facing the front surface and comprising a window passing through the front and rear surfaces, the window having one or more surfaces inclined from the front surface toward the rear surface; and a conductive pattern arranged along an inclined surface of the window so as to extend from the front surface to the rear surface of the substrate body.

14 Claims, 7 Drawing Sheets

SEMICONDUCTOR PACKAGE SUBSTRATE AND SEMICONDUCTOR PACKAGE INCLUDING THE SAME

CROSS-REFERENCES TO RELATED APPLICATIONS

The present application claims priority under 35 U.S.C 119(a) to Korean Application No. 10-2011-0107107, filed on Oct. 19, 2011 in the Korean intellectual property Office, which is incorporated herein by reference in its entirety set forth in full.

BACKGROUND

1. Field of the Invention

Various embodiments of the present disclosure relate to a substrate used for a semiconductor package and a semiconductor package including the same.

2. Description of the Related Art

With high performance of electric/electronic products and reduction in size and weight of electronic devices, it has become important to reduce the thickness of packages and increase the density of packages. With the increase in memory capacity of computers, notebooks, and mobile phones, the capacity of chips such as large-capacity RAM and flash memory has increased, but the size of packages has decreased. In order to implement such packages, research has been conducted according to the trend where the size of packages is reduced. Furthermore, various techniques for mounting a larger number of packages in a substrate having a limited area are being researched.

In order to reduce the size of a package, a technique which is capable of reducing the size and thickness of a package while using chips having the same memory capacity has been proposed, and the package is typically referred to as a flip chip package. The flip chip package has a structure in which a semiconductor chip and a printed circuit board (PCB) are electrically coupled through a bump formed on a bonding pad of a chip. Since the transmission of electrical signals between the chip and the PCB is performed only by the bump, the flip chip package has a very short signal transmission path. Therefore, the flip chip package technique is known as a packaging technique suitable for high-speed devices.

In the flip chip package, a semiconductor chip is directly coupled to a package substrate through a bump formed on a bonding pad thereof, and the package substrate is coupled to a system substrate through a solder ball formed on the opposite surface of the package substrate having the semiconductor chip mounted thereon. Therefore, two or more metal layers such as electrodes for coupling the semiconductor chip and the package substrate and electrodes for coupling the system substrate and the package substrate are required to implement the flip chip package. Furthermore, such metal layers are coupled through conductive vias formed in the substrate.

However, when pluralities of metal layers are coupled through conductive vias, the metal layers may be discontinuously coupled. The discontinuous coupling between the metal layers for signal transmission has no problem when DC current for power supply or a signal operating at a relatively low frequency is transmitted to a semiconductor chip. However, the discontinuous coupling may cause impedance mismatch when a signal operating at a high frequency is transmitted.

FIGS. 1A and 1B are graphs showing an insertion loss and a return loss for a signal frequency, respectively.

Referring to FIG. 1A (i.e., y-axis is LOSS and x-axis is FREQUENCY), when a substrate is not used, there is no signal loss, which is indicated by a thin line. However, when the substrate is used, a rapid signal transmission loss occurs in a specific frequency band, which is indicated by a thick line.

Referring to FIG. 1B (i.e., y-axis is LOSS and x-axis is FREQUENCY), when a substrate is not used, there is no signal loss, which is indicated by a thin line. However, when the substrate is used, a rapid signal transmission loss occurs in a specific frequency band, which is indicated by a thick line.

Such a loss may be caused by impedance mismatch of transmission lines. Furthermore, when a semiconductor chip and a system substrate is coupled through conductive vias, a signal transmission path between the semiconductor chip and the system substrate may be lengthened. This may cause signal delay.

SUMMARY

Various embodiments generally relate to a semiconductor package substrate capable of preventing impedance mismatch which occurs when pluralities of metal layers are coupled through a conductive via, and a semiconductor package having the same.

In an embodiment, a semiconductor package substrate includes: a substrate body having a front surface on which a semiconductor chip is mounted and a rear surface facing the front surface and including a window passing through the front and rear surfaces, the window having one or more surfaces inclined from the front surface toward the rear surface; and a conductive pattern arranged along an inclined surface of the window so as to extend from the front surface to the rear surface of the substrate body.

The inclined surface of the window may be formed in such a manner that the window is widened from the front surface toward the rear surface of the substrate body. Furthermore, the window may be formed in a region corresponding to a region where a bonding structure of the semiconductor chip is disposed, such that a path from the bonding structure provided in the semiconductor chip to a system substrate disposed under the semiconductor package substrate becomes as short as possible.

The conductive pattern may include an extended portion disposed on one or more of the front and rear surfaces of the substrate body. The conductive pattern may include Cu or Au.

The semiconductor package substrate may further include a filling material filling at least a part of the window.

In an embodiment, a semiconductor package includes: a semiconductor chip; and a package substrate electrically coupled to the semiconductor chip. The package substrate includes: a substrate body having a front surface on which the semiconductor chip is mounted and a rear surface facing the front surface and including a window passing through the front and rear surfaces, the window having one or more surfaces inclined from the front surface toward the rear surface; and a conductive pattern arranged along an inclined surface of the window so as to extend from the front surface to the rear surface of the substrate body.

The semiconductor chip may include a bonding structure disposed on a surface coupled to the package substrate. The bonding structure may include one or more of a contact pad electrically coupled to the conductive pattern, a pillar bump, and a solder bump.

The bonding structure may include a contact pad electrically coupled to the conductive pattern, a pillar bump formed over the contact pad, and a solder bump formed over the pillar bump.

The package substrate may be electrically coupled to a system substrate through the conductive pattern extended to the rear surface of the package substrate.

The inclined surface of the window may be formed in such a manner that the window is widened from the front surface toward the rear surface of the substrate body.

The inclined surface of the window may be formed in such a manner that the window is narrowed from the front surface toward the rear surface of the substrate body.

The window may be formed in a region corresponding to a region where a bonding structure of the semiconductor chip is disposed, such that a path from the bonding structure provided in the semiconductor chip to a system substrate disposed under the package substrate becomes as short as possible.

The conductive pattern may include an extended portion disposed on one or more of the front and rear surfaces of the substrate body.

The semiconductor package may further include a filling material filling at least a part of the window.

The semiconductor package may further include a through-via provided in the substrate body and electrically coupled to a system substrate. The semiconductor package may further include a power supply terminal disposed on one or more of the front and rear surfaces of the substrate and coupled to the through-via.

The semiconductor package may further include a first conductive pattern provided on the front surface of the substrate body and coupling a bonding structure formed in the semiconductor chip and the conductive pattern. The first conductive pattern may have substantially the same cross-sectional shape as the conductive pattern.

In an embodiment, a semiconductor package includes: a substrate body having a front surface configured for mounting a semiconductor chip on the front surface and a rear surface facing the front surface and comprising a window passing through the front and rear surfaces, the window having one or more surfaces inclined from the front surface toward the rear surface; and a conductive pattern arranged along an inclined surface of the window so as to extend from the front surface to the rear surface of the substrate body.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Figure 1A:
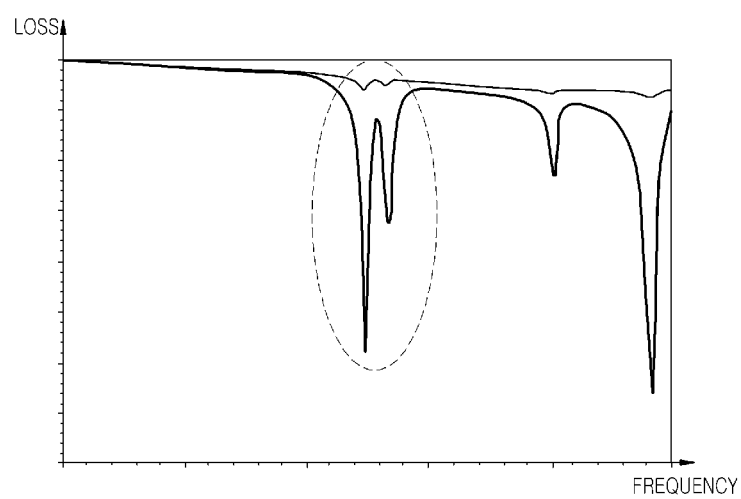
FIGS. 1A and 1B are graphs showing an insertion loss and a return loss for a signal frequency, respectively.
Figure 1B:
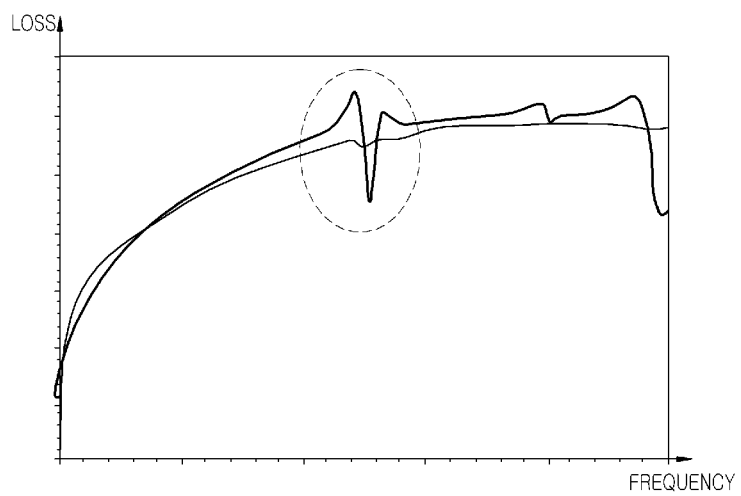

Hereinafter, various embodiments will be described with reference to accompanying drawings. However, the embodiments are for illustrative purposes only and are not intended to limit the scope of the invention. Also, the same reference numerals or the same reference designators may denote the same elements throughout the specification.

Figure 2:
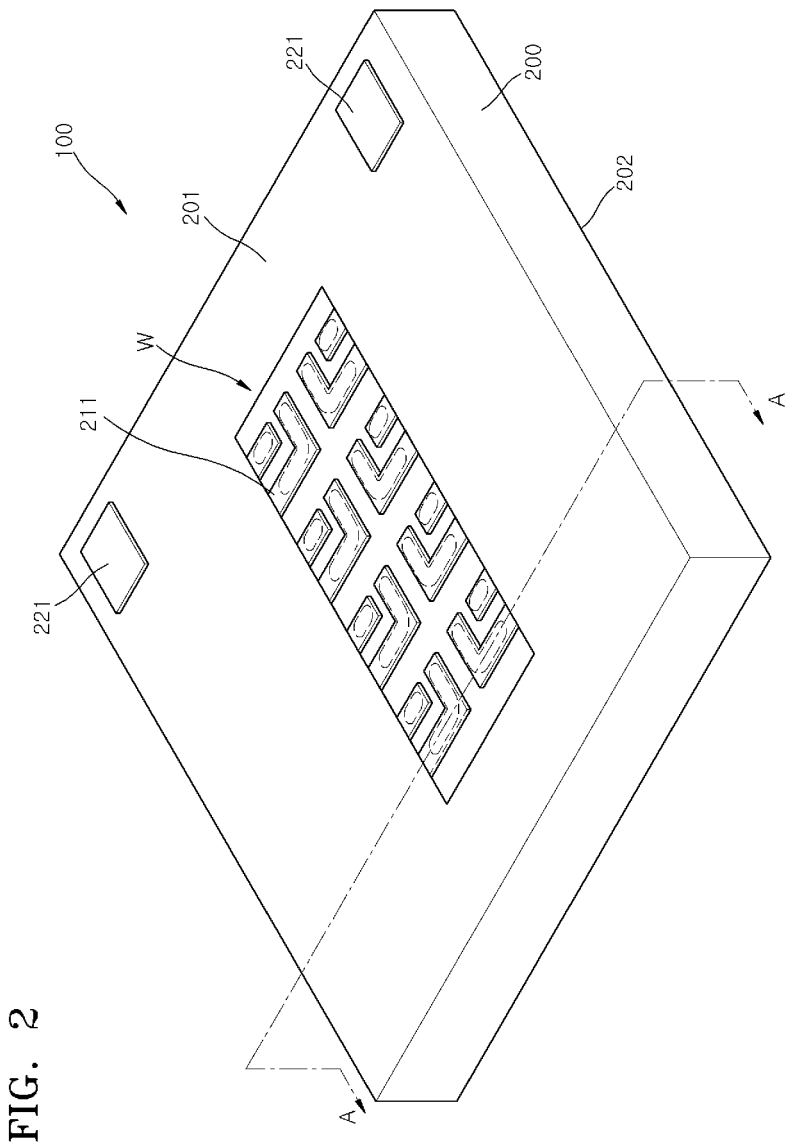
FIG. 2 is a front perspective view of a semiconductor package substrate in accordance with an embodiment.
Figure 3:
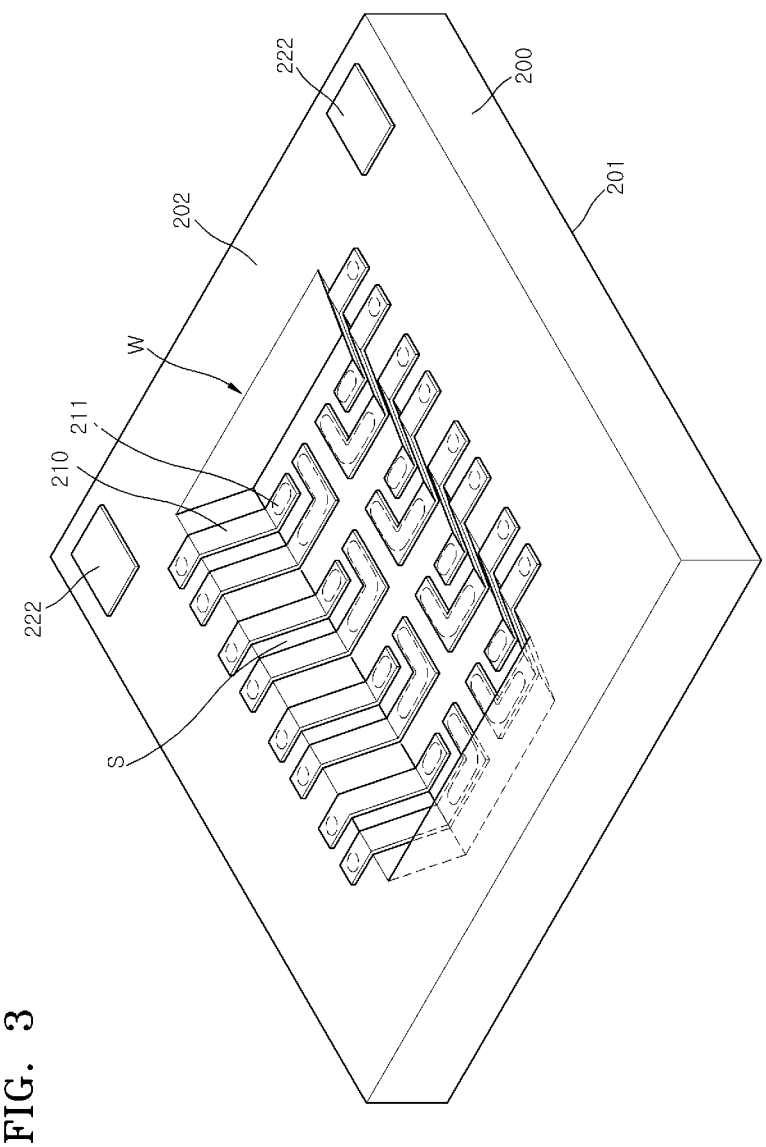
FIG. 3 is a rear perspective view of the semiconductor package substrate in accordance with an embodiment.
Figure 4:
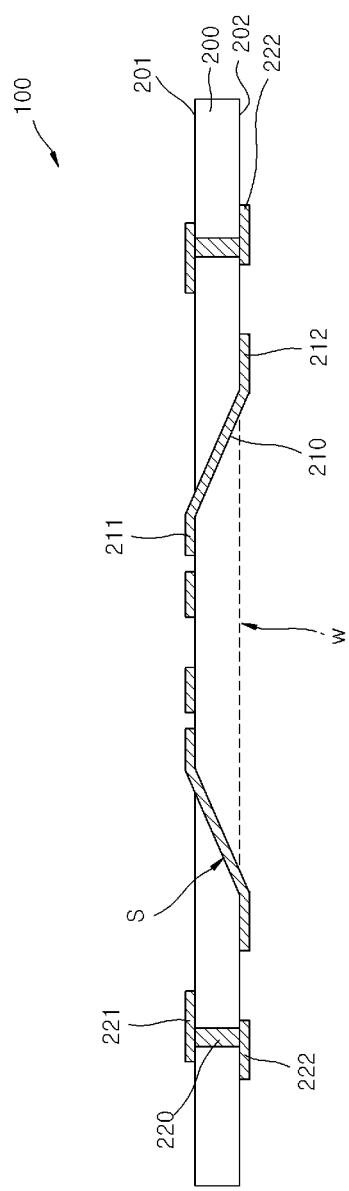
FIG. 4 is a cross-sectional view taken along a line A-A' of FIG. 2.

FIG. 2 is a front perspective view of a semiconductor package substrate in accordance with an embodiment. FIG. 3 is a rear perspective view of the semiconductor package substrate in accordance with an embodiment. FIG. 4 is a cross-sectional view taken along a line A-A' of FIG. 2.

Referring to FIGS. 2 to 4, the semiconductor package substrate 100 in accordance with an embodiment may include a substrate body 200 having a front surface 201 having a semiconductor chip mounted thereon and a rear surface 202 coupled to a system substrate. The semiconductor chip may include a semiconductor device such as a memory device or logic device.

In an example, the substrate body 200 may include a PCB formed of a copper clad laminate (CCL). In another example, the substrate body 200 may include a package substrate having a high elastic modulus and a low thermal expansion coefficient, in order to secure high reliability such as insulating property or thermal resistance and implement thickness reduction. In another example, the substrate body 200 may include a flexible PCB which is used for small and medium-sized electronic products such as mobile phones, digital cameras, and notebooks, has durability against repetitive bending operations, and may implement size reduction and high density. In another example, the substrate body 200 may include a high-functional heat-dissipating substrate for implementing electronic products such body electronic systems and light emitting diodes.

The substrate body 200 may include a window W formed in one region thereof, which passes through the front surface 201 and the rear surface 202. The window W may be disposed in a region of the substrate body, which corresponds to a region where bonding structures, for example, bumps are formed.

In an example, the window W may include four surfaces, but is not limited thereto. One or more of the surfaces forming the window W may include an inclined surface S formed at a predetermined angle from the front surface 201 of the substrate body 200 toward the rear surface 202. In an example, the inclined surface S may be formed in such a manner that the window W is widened from the front surface 201 of the substrate body toward the rear surface 202. In another example, the inclined surface S may be formed in such a manner that the window W is narrowed from the front surface 201 of the substrate body toward the rear surface 202. The direction and angle of the inclined surface S may be decided according to the positions of bonding structures formed on the semiconductor chip mounted on the substrate and bonding structures of the system substrate coupled to the bottom of the substrate.

Furthermore, two surfaces, four surfaces, or only one surface of the window W may be formed with an inclined surface S.

The substrate body 200 may include a plurality of conductive patterns 210 for electrical coupling with the semiconductor chip mounted on the substrate. The conductive patterns 210 may be arranged along the inclined surface S of the window W formed in the substrate body 210. Therefore, the number of inclined surfaces S may be decided according to the positions or number of conductive patterns 210. Furthermore, since signal transmission from the semiconductor chip to the system substrate is performed by the conductive patterns 210, the size of the window W and the angle of the inclined surfaces S may be set in such a manner that the signal transmission path from the semiconductor chip to the system substrate becomes as short as possible.

In order for favorable electrical coupling between the semiconductor chip mounted on the front surface 201 of the substrate body and the system substrate disposed at the rear surface 202 of the substrate body, each of the conductive patterns 210 has extended portions 211 and 212 which are extended to the front surface 201 and the rear surface 202, respectively. The extended portion 211 disposed on the front surface 201 of the substrate body is coupled to a bonding structure of the semiconductor chip mounted on the package substrate, for example, a bump. The extended portion 212 disposed on the rear surface 202 of the substrate body is electrically coupled to the system substrate. Therefore, the number of conductive patterns 210, the distance between conductive patterns 210, and the structure of the extended portions 211 and 212 may be decided in consideration of the number of bonding structures formed on the system substrate and the distance between bonding structures. In an example, when the semiconductor chip may include four lines of bumps, four lines of conductive patterns 210 may be arranged in the substrate body 200. In another example, when bumps formed in the semiconductor chip may be arranged in substantially a matrix shape, the conductive patterns 210 formed in the substrate body 200 may be arranged in substantially a matrix shape. Through the conductive patterns 210 having the extended portions 211 and 212, output signals from the semiconductor chip may be transmitted to the system substrate, or signals may be inputted from the system substrate to the semiconductor chip.

The conductive patterns 210 and the extended portions 211 and 212 may be formed of a metal layer. The metal layer may include Cu or Au. In an example, each of the conductive patterns 210 may have a stacked structure of first and second metal layers. In another example, the conductive pattern 210 may include a seed layer for electroplating and a metal layer formed by the seed layer according to an electroplating method. In another example, the conductive pattern 210 may include a metal layer which is laminated or patterned so as to extend to the front surface 201 and the rear surface 202 along the inclined surface.

Power supply terminals 221 and 222 may be disposed around the window W on the front and rear surfaces of the substrate body 200, respectively. The substrate body 200 may include a through-via 220 coupled to the power supply terminals 221 and 222 disposed on the front and rear surfaces of the substrate body 200, respectively. The through-via 220 disposed in such a manner may serve as a path for supplying power to the semiconductor chip mounted on the front surface 201 of the substrate body. Through the power supply terminals 221 and 222 and the conductive via 220, power may be supplied to the semiconductor chip from the system substrate. In general, DC power is used as power supplied to the semiconductor chip. Therefore, the power supplied to the semiconductor chip is not affected by impedance mismatch caused by change in the shape of the transmission path. The through-via 220 and the power supply terminals 221 and 222 are formed of a conductive material, for example, a metallic material.

Figure 5:
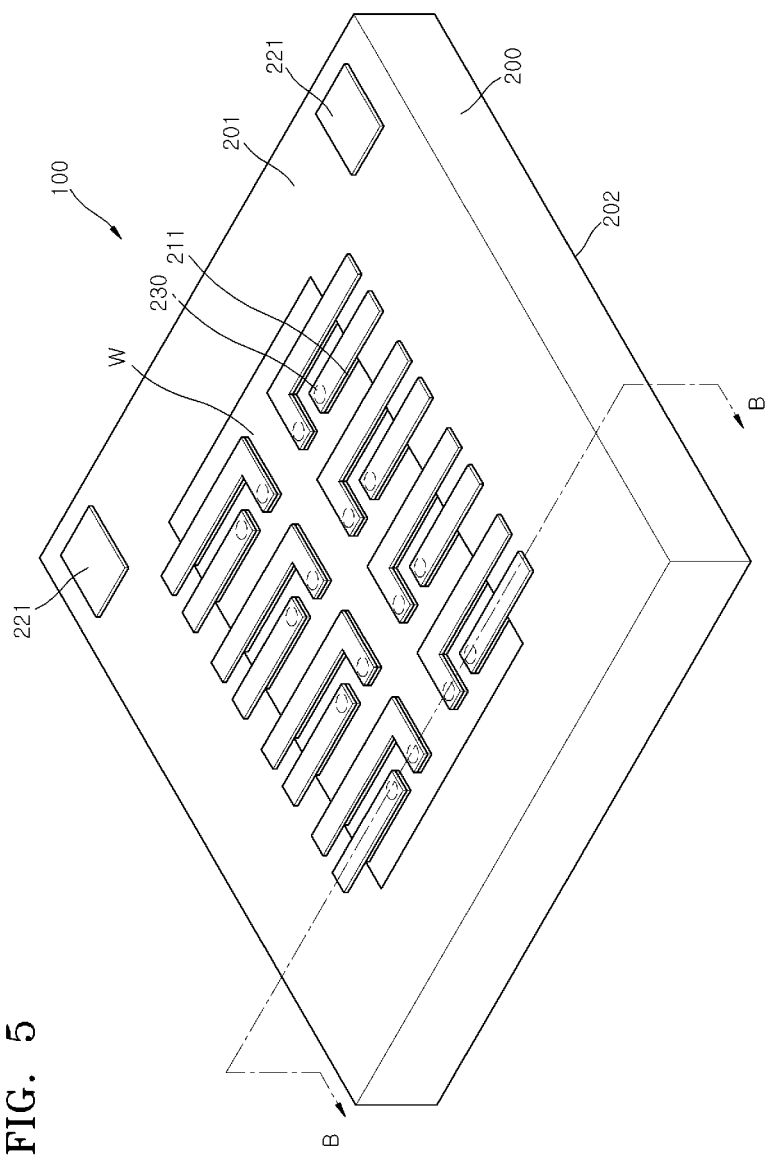
FIG. 5 is a front perspective view of a semiconductor package substrate in accordance with an embodiment.
Figure 6:
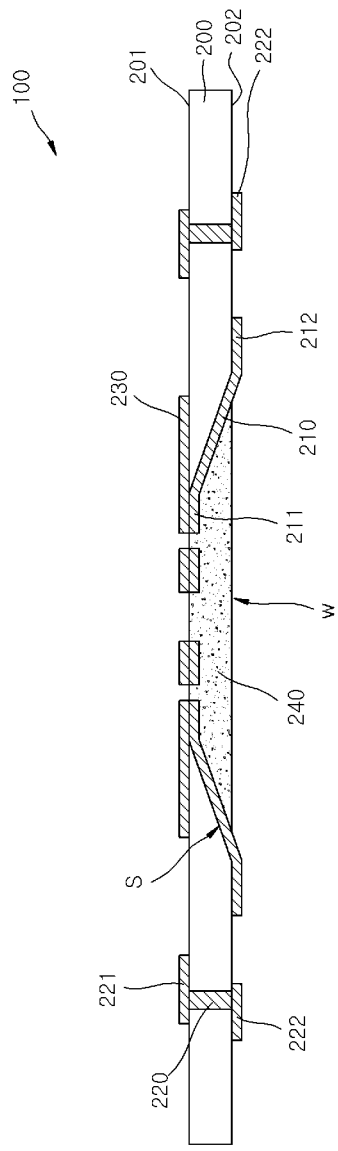
FIG. 6 is a cross-sectional view taken along a line B-B' of FIG. 5.

Referring to FIGS. 5 and 6, the window W provided in the substrate body may be filled with a filling material 240. The filling material 240 may include an insulation material such as silicon oxide ($SiO_2$), for example. When a material having excellent insulating properties and heat transfer properties, for example, ceramic paste is used as the filling material 240, heat generated from the semiconductor chip may be effectively discharged to the outside of the package, which makes it possible to further increase the reliability of the semiconductor device and the package.

The filling material may completely fill the window W as illustrated in FIG. 6 or may partially fill the window W in some cases. When the window W is filled with the filling material, it is possible to increase the reliability of the package.

Additionally, referring to FIG. 4, the window W may not be filled with a filling material. In this case, while the space between the semiconductor chip and the package substrate is filled with an under-filling material such as polymer after the semiconductor chip is mounted, an extra under-filling material may escape through the window W. Therefore, it is possible to obtain an effect of removing a void.

Figure 7:
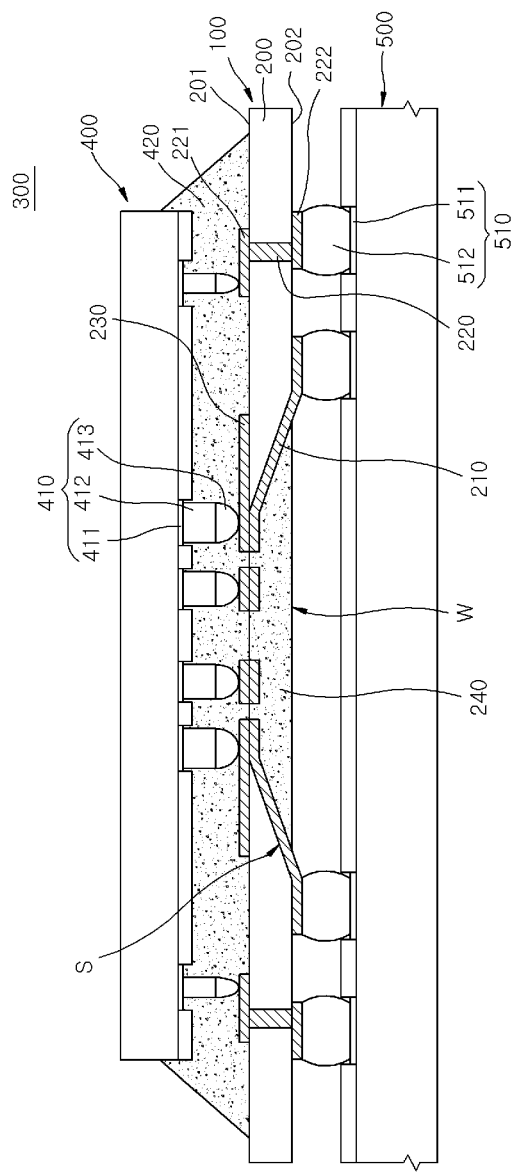
FIG. 7 is a cross-sectional view of a semiconductor package in accordance with an embodiment.

FIG. 7 is a cross-sectional view of a semiconductor package in accordance with an embodiment.

Referring to FIG. 7, the semiconductor package 300 may include the semiconductor package substrate 100 illustrated in FIG. 4 or 6 and a semiconductor chip 400 mounted on the front surface 201 of the package substrate. In this embodiment, the package substrate illustrated in FIG. 7 is applied.

Since the semiconductor package substrate 100 has the same structure as the package substrate described with reference to FIGS. 2 to 6, the duplicate descriptions thereof are omitted herein.

The semiconductor chip 400 may include semiconductor devices (not illustrated) such as a semiconductor memory device and a logic device, and a plurality of bonding structures 410 for electrical coupling with the package substrate 100 are provided on one surface of the semiconductor chip 400. Each of the bonding structures 410 may include one or more of a contact pad, a pillar bump, and a solder bump. In an example, the bonding structure 410 may include a contact pad 411 electrically coupled to a circuit formed in the semiconductor chip 400, a pillar bump 412 formed over the contact pad 411, and a solder bump 413 formed over the pillar bump 412. In another example, the bonding structure 410 may include a contact pad electrically coupled to a circuit formed in the semiconductor chip 400 and a solder bump formed over the contact pad.

The semiconductor chip 400 and the package substrate 100 are electrically coupled to each other through the bonding structures 410 of the semiconductor chip and the conductive patterns 210 arranged along the inclined surface of the window W formed in the package substrate. The space between the semiconductor chip 400 and the package substrate 100 may be filled with an under-filling material 420 such as polymer.

Additionally, the package substrate 100 may be electrically coupled to the system substrate 500 through the conductive patterns 210 arranged along the inclined surface of the window W formed in the substrate body 200 and the bonding structures 510 arranged in the system substrate 500. Each of the bonding structures 510 arranged in the system substrate 500 may include one or more of a contact pad, a pillar bump, and a solder bump. In an example, the bonding structure 510 of the system substrate may include a contact pad 511 electrically coupled to a circuit (not illustrated) formed in the system substrate 500 and a solder bump 512 formed over the contact pad 511. In another example, the bonding structure 510 may include a contact pad electrically coupled to a circuit formed in the system substrate 500 and a pillar bump formed over the contact pad.

Through the power supply terminals 221 and 222 provided in the package substrate 100 and the through-via 220 formed in the substrate body 200 to couple the power supply terminals 221 and 222, power may be supplied from the system substrate 500 to the semiconductor chip 400.

The window W provided in the package substrate 100 may be filled with a filling material 240. The filling material 240 may completely or partially fill the window. When a material having excellent insulating properties and heat transfer properties, for example, ceramic paste is used as the filling material 240, heat generated from the semiconductor chip may be effectively discharged to the outside of the package, which makes it possible to further increase the reliability of the semiconductor devices and the package. As described above, the window W of the package substrate 100 may not be filled with a filling material. In this case, while the space between the semiconductor chip 400 and the package substrate 100 is filled with an under-filling material such as polymer after the semiconductor chip is mounted, an extra under-filling material may escape through the window W. Therefore, it is possible to obtain an effect of removing a void of the under-filling material 420.

The various embodiments have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor package comprising:
   a package substrate comprising
   a substrate body having a front surface on which the semiconductor chip is mounted and a rear surface facing the front surface and comprising a window passing through the front and rear surfaces, the window having one or more surfaces inclined from the front surface toward the rear surface; and a conductive pattern arranged along an inclined surface of the window so as to extend from the front surface to the rear surface of the substrate body;
   a semiconductor chip having a plurality of bump electrically coupled to the package substrate,
   wherein the semiconductor chip and the package substrate are coupled to each other through the bump of the semiconductor chip and the conductive patterns of the package substrate.

2. The semiconductor package of claim 1, wherein the bump comprises a pillar bump and a solder bump, wherein the solder bump is disposed over the pillar bump.

3. The semiconductor package of claim 1, the semiconductor chip comprises a contact pad, wherein the contact pad is disposed under the bump.

4. The semiconductor package of claim 1, wherein the package substrate is electrically coupled to a system substrate through the conductive pattern extended to the rear surface of the package substrate.

5. The semiconductor package of claim 1, wherein the inclined surface of the window is formed in such a manner that the window is widened from the front surface toward the rear surface of the substrate body.

6. The semiconductor package of claim 1, wherein the inclined surface of the window is formed in such a manner that the window is narrowed from the front surface toward the rear surface of the substrate body.

7. The semiconductor package of claim 1, wherein the window is formed in a region corresponding to a region where the bump of the semiconductor chip is disposed, such that a path from the bump provided in the semiconductor chip to a system substrate disposed under the package substrate becomes as short as possible.

8. The semiconductor package of claim 1, wherein the conductive pattern comprises an extended portion disposed on one or more of the front and rear surfaces of the substrate body.

9. The semiconductor package of claim 1, wherein the conductive pattern comprises Cu or Au.

10. The semiconductor package of claim 1, further comprising a filling material filling at least a part of the window.

11. The semiconductor package of claim 1, further comprising a through-via provided in the substrate body and electrically coupled to a system substrate.

12. The semiconductor package of claim 11, further comprising a power supply terminal disposed on one or more of the front and rear surfaces of the substrate and coupled to the through-via.

13. The semiconductor package of claim 1, further comprising a first conductive pattern provided on the front surface of the substrate body and coupling the bump formed in the semiconductor chip and the conductive pattern.

14. The semiconductor package of claim 13, wherein the first conductive pattern has substantially the same cross-sectional shape as the conductive pattern.

* * * * *